United States Patent
Li et al.

(10) Patent No.: US 10,887,990 B2
(45) Date of Patent: Jan. 5, 2021

(54) POWER LINE STRUCTURE, ARRAY SUBSTRATE AND DISPLAY PANEL

(71) Applicant: BOE TECHNOLOGY GROUP CO., LTD., Beijing (CN)

(72) Inventors: Yunfei Li, Beijing (CN); Tian Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/704,193

(22) Filed: Dec. 5, 2019

(65) Prior Publication Data

US 2020/0113051 A1  Apr. 9, 2020

Related U.S. Application Data

(63) Continuation of application No. 15/553,649, filed as application No. PCT/CN2017/072983 on Feb. 6, 2017, now Pat. No. 10,617,004.

(30) Foreign Application Priority Data

May 20, 2016 (CN) .......................... 2016 1 0341305

(51) Int. Cl.
  *H05K 1/11*  (2006.01)
  *G09G 3/3225*  (2016.01)
  (Continued)

(52) U.S. Cl.
  CPC ........... *H05K 1/115* (2013.01); *G09G 3/3225* (2013.01); *H01L 27/124* (2013.01); *H01L 27/32* (2013.01);
  (Continued)

(58) Field of Classification Search
  CPC .... H05K 1/115; H05K 1/0296; H05K 5/0017; H05K 2201/09609; G09G 3/3225; H01L 27/124; H01L 27/32; H01L 27/3279
  See application file for complete search history.

(56) References Cited

U.S. PATENT DOCUMENTS 4,715,117 A   12/1987  Enomoto
6,407,345 B1   6/2002  Hirose
(Continued)

FOREIGN PATENT DOCUMENTS

CN   1937024 A    3/2007
CN   102201199 A  9/2011
(Continued)

OTHER PUBLICATIONS

Extended European Search Report issued by the European Patent Office for corresponding European Patent Application No. 17755046.4, dated Jan. 15, 2020.
(Continued)

*Primary Examiner* — Sejoon Ahn
(74) *Attorney, Agent, or Firm* — Dilworth & Barrese, LLP.; Michael J. Musella, Esq.

(57) ABSTRACT

A power line structure, an array substrate including the power line structure and a display panel are provided. The power line structure (100) includes a conductive plate (110), the conductive plate (110) includes a through hole disposing area (103), the through hole disposing area (103) is provided with a plurality of via holes (101); in at least one sub-area of the through hole disposing area (103), a distribution density of the via holes (101) increases along a direction of decreasing a current density in the conductive plate (110).

16 Claims, 4 Drawing Sheets

(51) Int. Cl.
  *H01L 27/12* (2006.01)
  *H01L 27/32* (2006.01)
  *H05K 1/02* (2006.01)
  *H05K 5/00* (2006.01)
(52) U.S. Cl.
  CPC ....... *H01L 27/3279* (2013.01); *H05K 1/0296* (2013.01); *H05K 5/0017* (2013.01); *H05K 2201/09609* (2013.01)

(56) References Cited

U.S. PATENT DOCUMENTS

| | | |
|---|---|---|
| 2002/0027022 A1 | 3/2002 | Moriizumi |
| 2005/0162081 A1 | 7/2005 | Kwak et al. |
| 2006/0046475 A1 | 3/2006 | Wark |
| 2007/0052899 A1 | 3/2007 | Lin |
| 2007/0083784 A1 | 4/2007 | Park et al. |
| 2008/0179593 A1 | 7/2008 | Lim |
| 2009/0146943 A1 | 6/2009 | Kim |
| 2011/0234083 A1 | 9/2011 | Ikeda |
| 2014/0353632 A1 | 12/2014 | Park et al. |
| 2016/0126304 A1 | 5/2016 | Cho et al. |
| 2016/0247454 A1* | 8/2016 | Park ................ G09G 3/3266 |
| 2016/0247826 A1* | 8/2016 | Miyagi ............ G02F 1/133345 |

FOREIGN PATENT DOCUMENTS

| | | |
|---|---|---|
| CN | 104217656 A | 12/2014 |
| CN | 105576001 A | 5/2016 |
| CN | 105977260 A | 9/2016 |
| JP | H04258151 A | 9/1992 |

OTHER PUBLICATIONS

Search Report and Written Opinion dated May 3, 2017 from State intellectual Property Office of the P.R. China.

* cited by examiner

POWER LINE STRUCTURE, ARRAY SUBSTRATE AND DISPLAY PANEL

REFERENCE TO PRIOR APPLICATIONS

The present application is a continuation of prior application Ser. No. 15/553,649, filed Aug. 25, 2017, which claims priority of Chinese Patent Application No. 201610341305.8 filed on May 20, 2016, the disclosure of each of which is incorporated herein by reference in its entirety as part of the present application.

TECHNICAL FIELD

Embodiments of the present disclosure relate to a power line structure, an array substrate and a display panel.

BACKGROUND

In a display field, organic light emitting diode (OLED) display panels have characteristics such as self-illumination, high contrast, thin thickness, availability for flexible panel, and being easy to fabricate, and have a broad development prospects.

Because of the characteristics mentioned above, an organic light emitting diode (OLED) display panel can be applied to a mobile phone, a display, a notebook computer, a digital camera, an instrument and other devices with a display function.

SUMMARY

An embodiment of the present disclosure provides a power line structure, which comprises a conductive plate provided with a through hole disposing area, the through hole disposing area is provided with a plurality of via holes; in at least one sub-area of the through hole disposing area, a distribution density of the via holes increases along a direction of decreasing a current density in the conductive plate.

For example, in the power line structure provided by an embodiment of the present disclosure, the conductive plate comprises at least two input terminals.

For example, in the power line structure provided by an embodiment of the present disclosure, the input terminals are disposed on a side of the conductive plate.

For example, in the power line structure provided by an embodiment of the present disclosure, the conductive plate comprises a plurality of output terminals.

For example, in the power line structure provided by an embodiment of the present disclosure, the output terminals are disposed on the other side of the conductive plate opposite to the input terminals.

For example, in the power line structure provided by an embodiment of the present disclosure, the via holes have a shape of one or any combination of more than two of a square, a circle, a rectangle, and a parallelogram.

For example, in the power line structure provided by an embodiment of the present disclosure, the distribution density of the via holes increases linearly along the direction of decreasing the current density in the conductive plate.

For example, in the power line structure provided by an embodiment of the present disclosure, the conductive plate comprises a first input terminal and a second input terminal; the direction of decreasing current density comprises a first direction from the first input terminal to a middle point between the first input terminal and the second input terminal, and a second direction from the second input terminal to the middle point between the first input terminal and the second input terminal; and the distribution density of the via holes comprises a first partial density increasing along the first direction and a second density increasing along the second direction.

For example, in the power line structure provided by an embodiment of the present disclosure, the first partial density increases linearly along the first direction, and the second partial density increases linearly along the second direction.

An embodiment of the present disclosure further provides an array substrate, which comprises the power line structure provided by at least one embodiment of the present disclosure and a fan-out lead structure, and the fan-out lead structure comprises a plurality of data fan-out leads.

For example, the array substrate provided by an embodiment of the present disclosure further comprises: a plurality of sub-pixel areas; an OLED drive circuit disposed in each of the sub-pixel areas, the OLED drive circuit comprising a first interface and a second interface; a plurality of data lines; and a plurality of drive power lines. Each of the drive power lines is connected with the first interface of the OLED drive circuit and the conductive plate, each of the data lines is connected with the second interface of the OLED drive circuit and one of the data fan-out leads For example, in the array substrate provided by an embodiment of the present disclosure, the conductive plate comprises a through hole pattern area, the fan-out lead structure comprises a fan-out lead area, an orthogonal projection of the via hole pattern area of the conductive plate on a surface of the array substrate is completely overlapped with an orthogonal projection of the fan-out lead area on the surface of the array substrate.

For example, in the array substrate provided by an embodiment of the present disclosure, the through hole disposing area provided with the plurality of via holes is located in the through hole pattern area.

For example, in the array substrate provided by an embodiment of the present disclosure, an orthogonal projection of at least part of the plurality of via holes on a surface of the array substrate is partially overlapped with an orthogonal projection of the data fan-out leads on the surface of the array substrate.

For example, in the array substrate provided by an embodiment of the present disclosure, an orthogonal projection of each of the via holes on a surface of the array substrate is partially overlapped with an orthogonal projection of the data fan-out leads on the surface of the array substrate.

For example, in the array substrate provided by an embodiment of the present disclosure, an orthogonal projection of each of the via holes on a surface of the array substrate is within the range of an orthogonal projection of the data fan-out leads on the surface of the array substrate.

An embodiment of the present disclosure further provides a display panel, comprising the array substrate provided by at least one embodiment of the present disclosure.

BRIEF DESCRIPTION OF THE DRAWINGS

In order to clearly illustrate the technical solution of embodiments of the present disclosure, the drawings of the embodiments or related technical description will be briefly described in the following; it is obvious that the drawings in the description are only related to some embodiments of the present disclosure and not limited to the present disclosure.

REFERENCE NUMERALS

Figure 1:
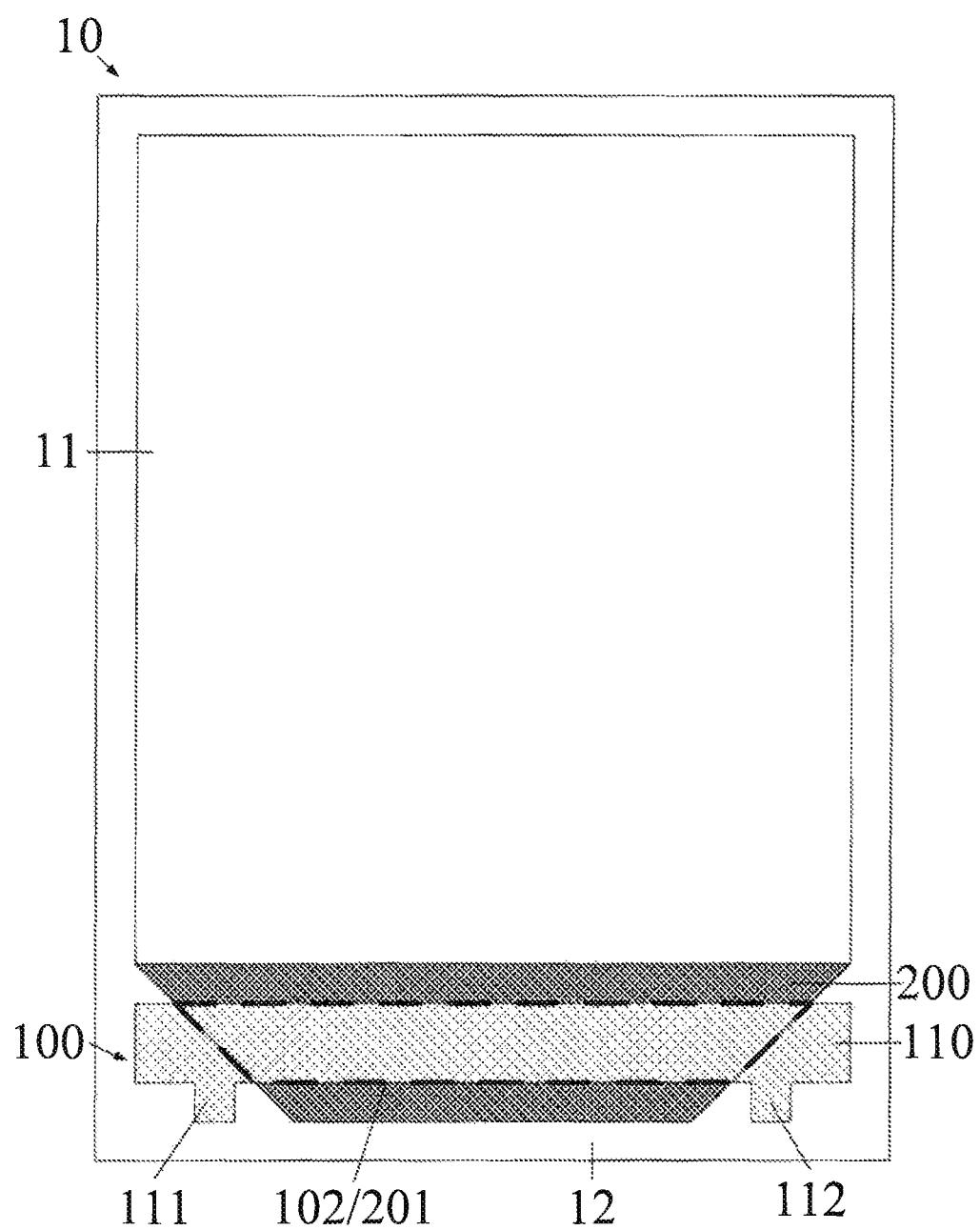
FIG. 1 is a top view of an array substrate provided by an embodiment of the present disclosure.

10—array substrate; 11—display area; 12—bottom border; 20—opposing substrate; 30—display panel; 100—power line structure; 101—through hole; 102—through hole pattern area; 103—through hole disposing area; 110—conductive plate; 111—first input terminal; 112—second input terminal; 113—third input terminal; 114—middle point between the first input terminal and the second input terminal; 115—middle point between the second input terminal and the third input terminal; 116—output terminal; 120—sub-pixel area; 122—OLED drive circuit; 124—data line; 126—drive power line; 200—fan-out lead structure; 201—fan-out lead area; 210—data fan-out lead; 250—non-through-hole disposing area; D1—first direction; D2—second direction; D3—third direction; D4—fourth direction.

DETAILED DESCRIPTION

The technical solutions of the embodiments will be described in a clearly and fully understandable way in connection with the drawings related to the embodiments of the disclosure. With reference to non-limitative embodiments shown in the drawings and described in detail below, the embodiments of the present disclosure and their various features and advantageous details will be described more fully. It should be noted that the features shown in the drawings are not drawn in a real scale. The present disclosure omits the description of the known materials, components, and process techniques, so as not to blur the embodiments of the present disclosure. The provided examples are only intended to understand the implementation of the embodiments of the present disclosure, and so that the skilled in the field can implement the embodiments. Thus, these embodiments should not be interpreted as limitations of the scope of the embodiments of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. In addition, in the embodiments of the present disclosure, the same or the similar reference labels represent the same or the similar components.

An organic light-emitting diode (OLED) device is a current drive type device, and in an array substrate or a display panel, a power line for powering an OLED device is usually provided. Because a power line has some resistance, in a case that current flows through the drive power line, a certain voltage drop (IR drop) can be generated, which leads to increase power consumption of the display panel and a short of voltage applied to the OLED device.

In order to reduce the voltage drop on a power line, the power line may be set to be a structure with a bigger width, for example, the power line has a shape of a plate or a flake so as to reduce resistance of the power line, and in turn reduce the voltage drop of the power line.

In a product design, in order to reduce the size of a border in a display panel and facilitate the product design, a power line and a data fan-out lead (or other like signal lines) may be located in different layers of the same area, thus, the power line and the data fan-out lead can be overlapped, and a cross talk phenomenon may occur between the power line and the data fan-out lead, and the cross talk phenomenon may affect the display effect of the display panel.

In order to reduce the voltage drop over a power line and reduce cross talk between the power line and the data fan-out lead, the shape of the power line can be set into be a shape of plate with small resistance, and the plate shaped power line is provided with a plurality of via holes. Therefore, on one hand, the voltage drop of the power line is reduced, and on the other hand, the cross talk between the power line and the data fan-out lead is reduced as well.

Embodiments of the present disclosure provide a power line structure, an array substrate comprising the power line structure, and a display panel. The power line structure comprises a conductive plate, the conductive plate comprises a through hole disposing area which is provided with a plurality of via holes; in at least one sub-area of the through hole disposing area, the distribution density of the via holes increases along a direction of decreasing current density in the conductive plate. Compared to a power line structure with via holes distributed uniformly, the power line structure provided by an embodiment of the present disclosure can obtain better technical effects in reducing the voltage drop of the power line in a case that the total area of the via holes are the same as that of the power line structure with via holes distributed uniformly (that is, cross-talk reduction is the same).

For example, FIG. 1 is a top view of an array substrate provided by an embodiment of the present disclosure. As illustrated in FIG. 1, an embodiment of the present disclosure provides an array substrate 10, which comprises a power line structure 100 and a fan-out lead structure 200. The fan-out lead structure 200 comprises a plurality of data fan-out leads.

In some examples, the power line structure 100 comprises a conductive plate 110. The conductive plate 110 comprises at least two input terminals. For example, the conductive plate 100 comprises a first input terminal 111 and a second input terminal 112. The first input terminal 111 and the second terminal 112 are disposed on a side of the conductive plate 110. For example, the first input terminal 111 and the second input terminal 112 are disposed on a side of the conductive plate 110 close to a bottom border 12 in the array substrate 10. The conductive plate 110 comprises a plurality of output terminals (not illustrated in FIG. 1), and the output terminals are disposed on the other side of the conductive plate 110 opposite to the first input terminal 111 and the second terminal 112. For example, the output terminals are disposed on a side of the conductive plate 110 close to a display area 11 in the array substrate 10.

For example, in the array substrate 10 provided by an embodiment of the present disclosure, the conductive plate 110 comprises a through hole pattern area 102, the fan-out lead structure 200 comprises a fan-out lead area 201, an orthogonal projection of the via hole pattern area 102 of the conductive plate 110 on a surface of the array substrate 10 is completely overlapped with an orthogonal projection of the fan-out lead area 201 of the fan-out lead structure 200 on the surface of the array substrate 10. Because FIG. 1 is a top view of the array substrate 10, the through hole pattern area 102 and the fan-out lead area 201 are overlapped together in FIG. 1, that is, the area surrounded by the dotted lines in FIG. 1.

For example, the through hole pattern area 102 of the conductive plate 110 is a region surrounded by the side of the conductive plate 110 close to the bottom border 12 in the array substrate 10, the side of the conductive plate 110 close to the display area 11 in the array substrate, and the orthogonal projection of the outer edges of the two outermost data fan-out leads on the conductive plate 110. That is, the data fan-out leads and the conductive plate 110 are overlapped only within the through hole pattern area 102 (fan-out lead area 201).

Figure 2:
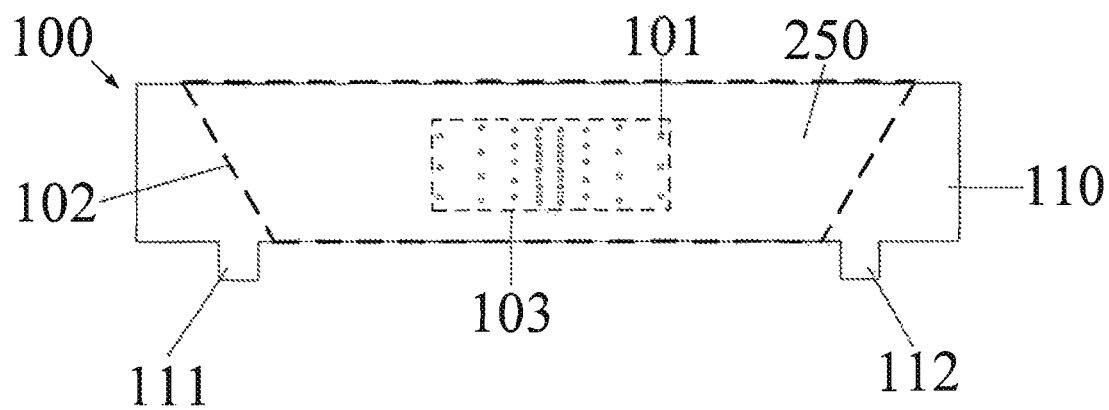
FIG. 2 is a first op view of a power line structure provided by an embodiment of the present disclosure.

For example, FIG. 2 is the first top view of a power line structure provided by an embodiment of the present disclosure; as illustrated in FIG. 2, a through hole disposing area 103 of the conductive plate 110 is disposed within the through hole pattern area 102. For example, the through hole disposing area 103 of the conductive plate 110 may be the whole through hole pattern area 102; or, the through hole disposing area 103 is a portion of the through hole pattern area 102.

For example, as illustrated in FIG. 2, an embodiment of the present disclosure provides a power line structure 100. The power line structure 100 comprises the conductive plate 110, and the conductive plate 110 comprises the through hole disposing area 103 provided with a plurality of via holes 101. In at least one sub-area of the through hole disposing area 103, the distribution density of the via holes 101 increases along a direction of decreasing the current density in the conductive plate 110.

In some examples, in at least one sub-area of the through hole disposing area 103, the distribution density of the via holes 101 increases along the direction of decreasing the current density in the conductive plate 110; and in other sub-areas of the through hole disposing area 103, the via holes 101 may be distributed uniformly or in other manners. Or, in the whole through hole disposing area 103, the distribution density of the via holes 101 increases along the direction of decreasing the current density in the conductive plate 110.

For example, the through hole disposing area 103 comprises a portion of the through hole pattern area 102, and the via holes 101 may be only disposed in the through hole disposing area 103; that is, the through hole pattern area 102 may comprise the through hole disposing area 103 provided with the via holes 101 and comprise a non-through-hole disposing area 250.

Figure 3A:
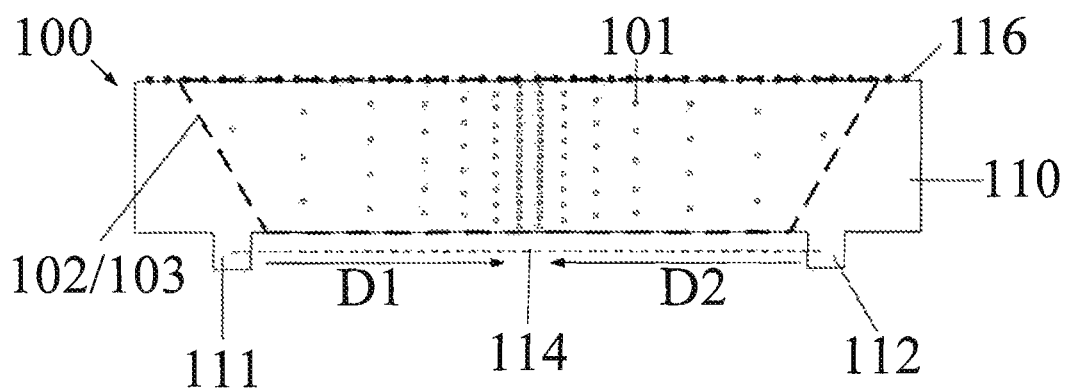
FIG. 3A is a second top view of a power line structure provided by an embodiment of the present disclosure.

For example, FIG. 3A is a second top view of a power line structure provided by an embodiment of the present disclosure; as illustrated in FIG. 3A, an embodiment of the present disclosure provides a power line structure 100, which comprises a conductive plate 110, and the conductive plate 110 comprises a through hole disposing area 103 provided with a plurality of via holes 101. In at least one sub-area of the through hole disposing area 103, the distribution density of the via holes 101 increases along a direction of decreasing the current density in the conductive plate 110.

For example, the through hole disposing area 103 is overlapped with the through hole pattern area 102.

For example, in the power line structure 100 provided by an embodiment of the present disclosure, the conductive plate 110 comprises at least two input terminals. For example, the conductive plate 110 comprises the first input terminal 111 and the second input terminal 112.

For example, in the power line structure 100 provided by an embodiment of the present disclosure, the input terminals are disposed on a side of the conductive plate 110. For example, the first input terminal 111 and the second input terminal 112 are disposed on the same side of the conductive plate 110.

For example, in the power line structure 100 provided by an embodiment of the present disclosure, the conductive plate 110 comprises a plurality of output terminals 116.

For example, in the power line structure 100 provided by an embodiment of the present disclosure, the output terminals 116 are disposed on the other side of the conductive plate opposite to the first input terminal 111 and the second input terminal 112.

For example, the distribution density of the via holes 101 refers to the number of the via holes 101 per unit area, and the current density in the conductive plate 110 refers to the amount of electricity in a unit area of the conductive plate 110 per unit time. The current flows in through the input terminals of the conductive plate 110, and flows out by the output terminals of the conductive plate 110, so that different positions of the conductive plate 110 may have different current density values. The distribution density of the via holes 10 increases along the direction of decreasing the current density in the conductive plate 110, that is, at the position with a higher current density value, the distribution density of the via holes 101 is smaller in the conductive plate 110; at the position with a lower current density value, the distribution density of the via holes 101 is larger in the conductive plate 110. Assuming that the conductive plate 110 is divided into a plurality of tiny resistance units arranged, in a matrix, which are electrically connected in series and in parallel, the position with a smaller distribution density of the via holes 101 is equivalent to the position with the more resistive units connected in parallel. Because the resistance values of resistive units connected in parallel are less than the resistance value of any one of the resistive units that are not connected in parallel, the position with a smaller distribution density of the via holes 101, the resistance value of the conductive plate 110 per unit area is also smaller; the position with a larger distribution density of the via holes 101, the resistance value of the conductive plate 110 per unit area is also larger.

The above-described arrangement manner of the via holes 101 renders the resistance of an unit area at a position, where the current density in the conductive plate 110 is larger, to be smaller, and renders the resistance of an unit area at a position, where the current density in the conductive plate 110 is smaller, to be larger, and the voltage drop over the conductive plate is equal to the product of current and resistance. Therefore, compared to a power line structure 100 with via holes distributed uniformly, the power line structure 100 provided by an embodiment of the present disclosure can have better technical effects in reducing the voltage drop of the power line in a case that the total area of the via holes are the same as that of the power line structure with via holes distributed uniformly (that is, cross-talk reduction is the same), that is, the voltage drop of the power line can be reduced to a lower level, thereby saving the energy consumption of the display substrate and improving the brightness of the display substrate.

For example, in a power line structure 100 provided by an embodiment of the present disclosure, the via holes have a shape of one of square, circle, rectangle, and parallelogram, or are in any combination of more than two of the shapes.

It should be noted that, the shape of the via holes in the power line structure provided by an embodiment of the present disclosure includes, but is not limited to, one or any combination of more than two of square, circle, rectangle, and parallelogram, and may include other shapes.

For example, in the power line structure 100 provided by an embodiment of the present disclosure, the distribution density of the via holes increases linearly along the direction of decreasing the current density in the conductive plate. For example, the density of the via holes in the conductive plate is inversely proportional to the current density in the conductive plate.

For example, as illustrated in FIG. 3A, in the power line structure 100 provided by an embodiment of the present disclosure, the conductive structure 110 comprises a first input terminal 111 and a second input terminal 112; the direction of decreasing the current density comprises a first direction D1 from the first input terminal 111 to a middle point 114 between the first input terminal 111 and the second input terminal 112, and a second direction D2 from the second input terminal 112 to the middle point 114 between the first input terminal 111 and the second input terminal 112; and the distribution density of the via holes comprises a first partial density increasing along the first direction D1 and a second density increasing along the second direction D2.

For example, in the power line structure 100 provided by an embodiment of the present disclosure, the first partial density increases linearly along the first direction D1, and the second partial density increases linearly along the second direction D2.

It should be noted that, an embodiment of the present disclosure includes but not limited to a case that the first partial density increases linearly along the first direction D1, and the second partial density increases linearly along the second direction D2; according to the different structure of the conductive plate 110 and the positions of the input terminals and the output terminals, the current density distribution in the conductive plate also becomes different, and then the distribution density of the via holes of the conductive plate also becomes different. For example, the current density in the conductive plate can be obtained by calculation or simulation.

For example, in an array substrate 100 provided by an embodiment of the present disclosure, the plurality of via holes 101 are disposed within a through hole pattern area 102. Because the via holes 101 are disposed to reduce crosstalk caused by the overlap between the power line structure 100 and the data fan-out leads, and the data fan-out leads and the power line structure 100 are overlapped only within the through hole pattern area 102, and therefore, the via holes 101 only need to be disposed in the through hole pattern area 102.

It should be noted that, an embodiment of the present disclosure includes but not limited to a case that the via holes are only disposed within the through hole pattern area 102.

For reasons such as facility for process, the via holes 101 may also be disposed in an area of the conductive plate 110 outside the through hole pattern area 102.

Figure 3B:
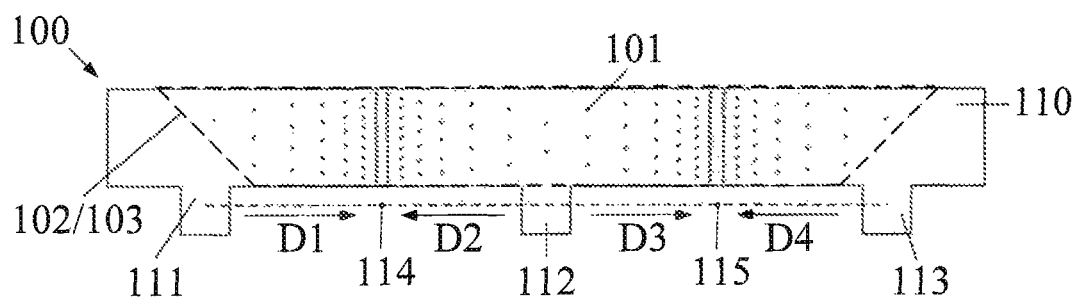
FIG. 3B is a third top view of a power line structure provided by an embodiment of the present disclosure.

For example, FIG. 3B is a third top view of a power line structure provided by an embodiment of the present disclosure, as illustrated in FIG. 3B, an embodiment of the present disclosure provides a power line structure 100 which comprises a conductive plate 110. The conductive plate 110 comprises a through hole disposing area 103, and the through hole disposing area 103 is provided with a plurality of via holes 101. In at least one sub-area of the through hole disposing area 103, the distribution density of the via holes 101 increases along a direction of decreasing the current density in the conductive plate 110.

For example, the through hole disposing area 103 is overlapped with a through hole pattern area 102.

For example, in the power line structure 100 provided by an embodiment of the present disclosure, the conductive plate 110 comprises at least two input terminals. For example, the conductive plate 110 comprises a first input terminal 111, a second input terminal 112, and a third input terminal 113.

For example, in the power line structure 100 provided by an embodiment of the present disclosure, the input terminals are disposed on a side of the conductive plate 110. For example, the first input terminal 111, the second input terminal 112 and the third input terminal 113 are disposed on a side of the conductive plate 110.

For example, in the power line structure 100 provided by an embodiment of the present disclosure, the conductive plate 110 comprises a plurality of output terminals (not illustrated in FIG. 3B).

For example, in the power line structure 100 provided by an embodiment of the present disclosure, the output terminals are disposed on the other side of the conductive plate 110 opposite to the first input terminal 111, the second input terminal 112 and the third input terminal 113.

For example, as illustrated in FIG. 3B, in the power line structure 100 provided by an embodiment of the present disclosure, the direction of decreasing the current density comprises a first direction D1 from the first input terminal 111 to a middle point 114 between the first input terminal 111 and the second input terminal 112, a second direction D2 from the second input terminal 112 to the middle point 114 between the first input terminal 111 and the second input terminal 112, a third direction D3 from the second input terminal 112 to a middle point 115 between the second input terminal 112 and the third input terminal 113, and a fourth direction D4 from the third input terminal 113 to the middle point 115 between the second input terminal 112 and the third input terminal 113. The distribution density of the via holes comprises a first partial density increasing along the first direction D1, a second density increasing along the second direction D2, a third density increasing along the third direction D3, and a fourth density increasing along the fourth direction D4.

For example, in the power line structure provided by an embodiment of the present disclosure, the first partial density increases linearly along the first direction D1, the second partial density increases linearly along the second direction D2, the third partial density increases linearly along the third direction D3, and the fourth partial density increases linearly along the fourth direction D4.

The common point(s) between the power line structure as illustrated in FIG. 3B and the power line structure as illustrated in FIG. 3A is not be repeated here, and relevant descriptions to the power line structure can refer to those to the power line structure as illustrated in FIG. 3A.

Figure 4:
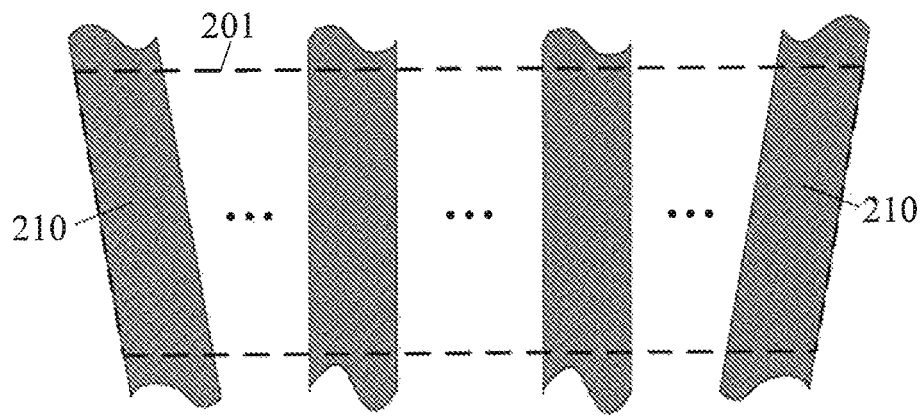
FIG. 4 is a top view of a fan-out lead area in an array substrate provided by an embodiment of the present disclosure.

For example, FIG. 4 is a top view of a fan-out lead area on an array substrate provided by an embodiment of the present disclosure. FIG. 4 illustrates a fan-out lead area 201 on an array substrate provided by an embodiment of the present disclosure. The fan-out lead area 201 comprises an overlapped portion between a plurality of data fan-out leads 210 and the conductive plate. As illustrated in FIG. 4, the fan-out lead area 201 on the fan-out lead structure 200 is a region of the fan-out lead structure 200 surrounded by an orthogonal projection of a side of the conductive plate 110 close to a bottom border 12 of the array substrate 10 on the fan-out lead structure 200, an orthogonal projection of a side of the conductive plate 110 close to a display area 11 in the array substrate on the fan-out lead structure 200, and the outer edges of the two outermost data fan-out leads.

Figure 5:
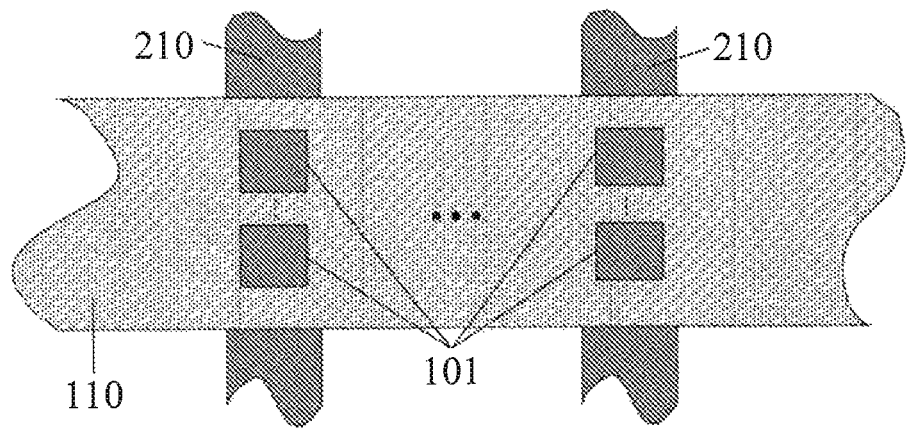
FIG. 5 is a first top view of a part of a conductive plate and a part of data fan-out leads in an array substrate provided by an embodiment of the present disclosure.
Figure 6:
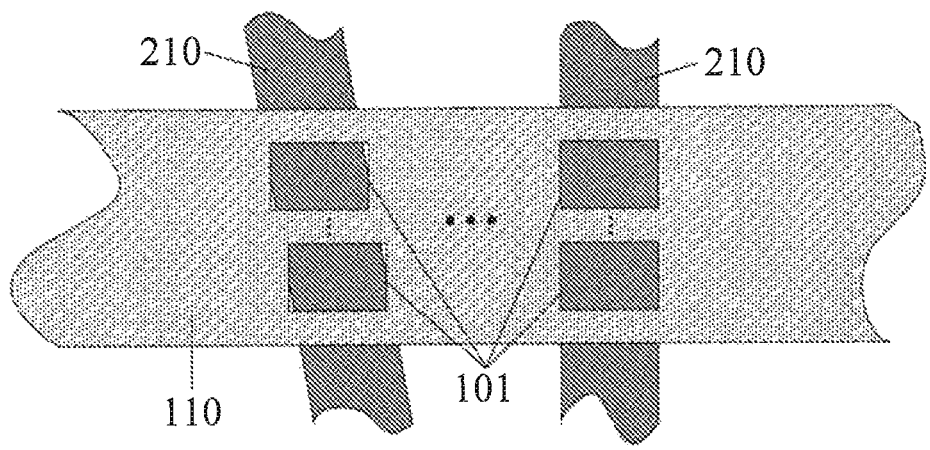
FIG. 6 is a second top view of a part of a conductive plate and a part of data fan-out leads in an array substrate provided by an embodiment of the present disclosure.

For example, FIG. 5 is the first top view of a part of a conductive plate and a part of data fan-out leads in an array substrate provided by an embodiment of the present disclosure. FIG. 6 is a second top view of a part of a conductive plate and a part of data fan-out leads in an array substrate provided by an embodiment of the present disclosure. As illustrated in FIG. 5 and FIG. 6, in an array substrate provided by an embodiment of the present disclosure, an orthogonal projection of at least a part of the plurality of via holes 101 on a surface of the array substrate is at least partially overlapped with an orthogonal projection of the data fan-out leads 210 on the surface of the array substrate.

For example, in the array substrate provided by an embodiment of the present disclosure, an orthogonal projection of each of the via holes 101 on a surface of the array substrate is partially overlapped with an orthogonal projection of the data fan-out leads 210 on the surface of the array substrate.

For example, in a case as illustrated in FIG. 5, the size of the via holes 101 (for example, the length and width of the via holes 101) is less than the line width of the data fan-out leads 210.

For example, in a case as illustrated in FIG. 6, the size of the via holes 101 (for example, the length and width of the via holes 101) is equal to the line width of the data fan-out leads 210. A portion of via holes 101 overlap with the data fan-out leads 210 corresponding thereto in the width direction(s) of the data fan-out leads 210.

Figure 7:
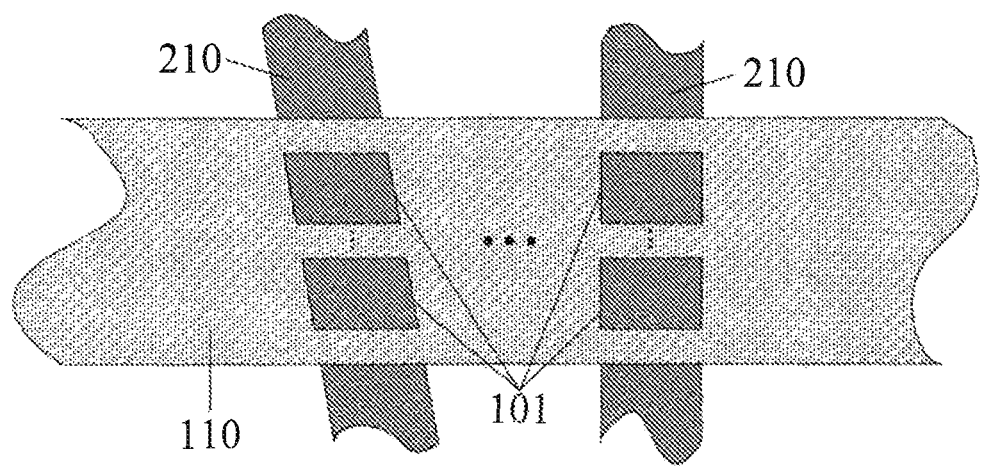
FIG. 7 is a third top view of a part of a conductive plate and a part of data fan-out leads in an array substrate provided by an embodiment of the present disclosure.

For example, FIG. 7 is a third top view of a part of a conductive plate and a part of data fan-out leads in an array substrate provided by an embodiment of the present disclosure, in a case as illustrated in FIG. 7, the shape of the via holes 101 may be selected according to the shape of the data fan-out leads 210, the via holes 101 comprise rectangular via holes and parallelogram via holes, an orthogonal projection of each of the via holes 101 on a surface of the array substrate is located within the range of an orthogonal projection of the data fan-out leads 210 on the surface of the array substrate.

For example, in order to reduce as much as possible the crosstalk between the data fan-out leads 210 and the conductive plate 110, the via holes 101 are provided that are as large as possible. However, in order to decrease the voltage drop of the conductive plate 110 meanwhile (i.e., decrease the voltage drop of the power line structure), each of the via holes 101 should be disposed that an orthogonal projection of each of the via holes 101 on a surface of the array substrate is located within the range of an orthogonal projection of the data fan-out leads 210 on the surface of the array substrate. Therefore, the shape and the size of the via holes 101 matches the shape and the size of the data fan-out leads, that is, the size of the via holes 101 (for example, the length or width of a rectangular via hole, the height of a parallelogram via hole, or the diameter of a rounded via hole etc.) is equal to the line width of the data fan-out leads, so as to reduce the crosstalk between the data fan-out leads 210 and the conductive plate 110 and reduce the voltage drop on the conductive plate 110 as well (that is, reduce the voltage drop of the power line structure).

Figure 8:
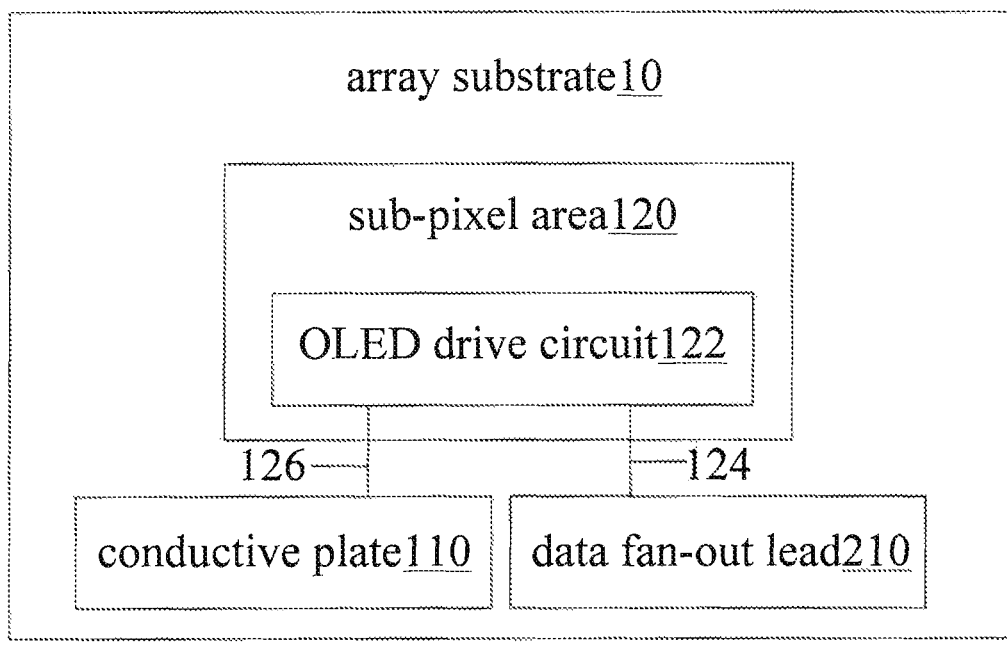
FIG. 8 is a view of an array substrate provided by an embodiment of the present disclosure.

For example, FIG. 8 is a view of an array substrate provided by an embodiment of the present disclosure, and as illustrated in FIG. 8, the array substrate 10 provided by an embodiment of the present disclosure further comprises: a plurality of sub-pixel areas 120; an OLED drive circuit 122 disposed in each of the sub-pixel areas 120; a plurality of data lines 124; and a plurality of drive power lines 126. Each of the drive power lines 126 is connected with a first interface of the OLED drive circuit and the conductive plate 110 (for example, a first end of each of the drive power lines 126 is connected with a drive interface of the OLED drive circuit 122, and a second end of each of the drive power lines 126 is connected with the output terminals of the conductive plate 110), each of the data lines 124 is connected with the second interface of the OLED drive circuit 122 and each of the data fan-out leads 210 (for example, a first end of each of the data lines 124 is connected with a data interface of the OLED drive circuit 122, and a second end of each of the data lines 124 is connected with the data fan-out leads 210).

For example, the drive current of the OLED flows in via the input terminals of the conductive plate 110, through the conductive plate 110, and from the output terminals of the conductive plate 110 to the drive power lines 126, and then through the drive power lines 126 into the drive interface of the OLED drive circuit 122, so as to drive an OLED device luminescence.

For example, a data signal is transmitted from a data fan-out lead 210 through the data line 124 to the data interface of the OLED drive circuit 122 to control the luminous intensity of the OLED drive device.

For example, the plurality of sub-pixel areas on an array substrate provided by an embodiment of the present disclosure each further comprise a thin film transistor (TFT), the data fan-out lead may be formed in the same layer as the gate electrode of the thin film transistor, and the power line structure may be formed in the same layer as the data line.

For example, the power line structure may be made of one alloy such as molybdenum-aluminum-molybdenum, molybdenum-aluminum-aluminum-molybdenum, titanium-aluminum-titanium, and titanium-aluminum-aluminum-titanium or any combination thereof.

For example, the via holes in the power line structure may be formed by a patterning process, such as a mask etching process (dry etching or wet etching).

Figure 9:
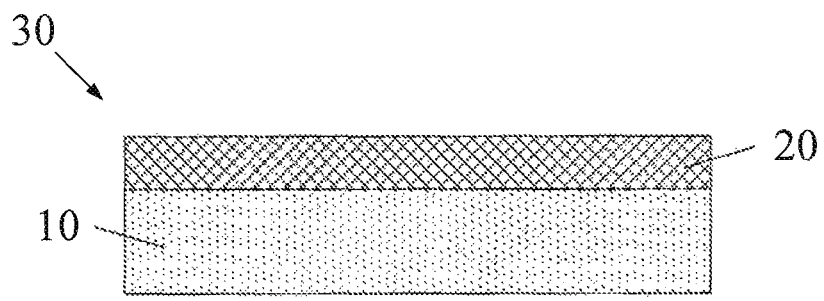
FIG. 9 is a sectional view of a display panel provided by an embodiment of the present disclosure.

For example, FIG. 9 is a sectional view of a display panel provided by an embodiment of the present disclosure, as illustrated in FIG. 9, an embodiment of the present disclosure further provides a display panel 30, which comprises the array substrate 10 provided by an embodiment of the present disclosure.

For example, the display panel 30 provided by an embodiment of the present disclosure further comprises an opposing substrate 20, and the opposing substrate 20 is such as a color filter substrate. The display panel 30 is formed by cell-assembling the array substrate 10 and the opposing substrate 20.

It should be noted that, the power line structure provided by an embodiment of the present disclosure is suitable for an OLED display panel, but not only limited to, and the power line structure is also suitable for other display panels or electronic devices that need to reduce crosstalk between the power line and other line(s).

For example, the display panel provided by an embodiment of the present disclosure may be used for a mobile phone, a tablet computer, a TV set, a monitor, a notebook computer, a digital photo frame, a navigator etc. and any products or components with display function.

An embodiment of the present disclosure provides a power line structure, an array substrate comprising the power line structure, and a display panel. The power line structure comprises a conductive plate. The conductive plate comprises a through hole disposing area, and the through hole disposing area is provided with a plurality of via holes; in at least one sub-area of the through hole disposing area, the distribution density of the via holes increases along a direction of decreasing the current density in the conductive plate. Compared to a power line structure with via holes distributed uniformly, the power line structure 100 provided by an embodiment of the present disclosure can have better technical effects in reducing the voltage drop of the power line in a case that the total area of the via holes are the same as that of the power line structure with via holes distributed uniformly (that is, cross-talk reduction is the same).

Although the present disclosure has be described in detail above through the general description and specific embodiments, but on the basis of the embodiments of the present disclosure, some modifications or improvements can be made, which is obvious to those skilled in the field. Therefore, these modifications or improvements made without departing from the spirit of the present disclosure are within the scope of the present disclosure.

The application claims priority to the Chinese patent application No. 201610341305.8, filed May 20, 2016, the entire disclosure of which is incorporated herein by reference as part of the present application.

What is claimed is:

1. A power line structure, comprising:
a conductive plate,
wherein the conductive plate comprises a through hole disposing area, and the through hole disposing area is provided with a plurality of via holes;
in at least one sub-area of the through hole disposing area, a distribution density of the via holes increases along a direction in which a density of current in the conductive plate decreases;
the conductive plate comprises at least two input terminals;
the at least two input terminals comprises a first input terminal, a second input terminal and a third input terminal;
the direction in which the density of current decreases comprises a first direction from the first input terminal to a middle point between the first input terminal and the second input terminal, a second direction from the second input terminal to the middle point between the first input terminal and the second input terminal, a third direction from the second input terminal to a middle point between the second input terminal and the third input terminal, and a fourth direction from the third input terminal to the middle point between the second input terminal and the third input terminal; and
the distribution density of the via holes comprises a first partial density increasing along the first direction, a second partial density increasing along the second direction, a third partial density increasing along the third direction, and a fourth partial density increasing along the fourth direction.

2. The power line structure according to claim 1, wherein the input terminals are disposed on a side of the conductive plate.

3. The power line structure according to claim 2, wherein the conductive plate comprises a plurality of output terminals.

4. The power line structure according to claim 3, wherein the output terminals are disposed on the other side of the conductive plate opposite to the input terminals.

5. The power line structure according to claim 1, wherein the via holes have a shape of one or any combination of more two of a square, a circle, a rectangle, and a parallelogram.

6. The power line structure according to claim 1, wherein the distribution density of the via holes increases linearly along the direction in which the density of current in the conductive plate decreases.

7. The power line structure according to claim 1, wherein the first partial density increases linearly along the first direction, the second partial density increases linearly along the second direction, the third partial density increases linearly along the third direction, and the fourth partial density increases linearly along the fourth direction.

8. An array substrate, comprising a power line structure and a fan-out lead structure,
wherein the fan-out lead structure comprises a plurality of data fan-out leads;
the power line structure comprises a conductive plate;
the conductive plate comprises a through hole disposing area, and the through hole disposing area is provided with a plurality of via holes;
in at least one sub-area of the through hole disposing area, a distribution density of the via holes increases along a direction in which a density of current in the conductive plate decreases;
the conductive plate further comprises a first input terminal, a second input terminal and a third input terminal;
the direction in which the density of current decreases comprises a first direction from the first input terminal to a middle point between the first input terminal and the second input terminal, and a second direction from the second input terminal to the middle point between the first input terminal and the second input terminal, a third direction from the second input terminal to a middle point between the second input terminal and the third input terminal, and a fourth direction from the third input terminal to the middle point between the second input terminal and the third input terminal; and
the distribution density of the via holes comprises a first partial density increasing along the first direction, a second partial density increasing along the second direction, a third partial density increasing along the third direction, and a fourth partial density increasing along the fourth direction.

9. The array substrate according to claim 8, further comprising:
a plurality of sub-pixel areas;
an organic light-emitting diode (OLED) drive circuit disposed in each of the sub-pixel areas, the OLED drive circuit comprising a first interface and a second interface;
a plurality of data lines; and
a plurality of drive power lines,
wherein each of the drive power lines is connected with the first interface of the OLED drive circuit and the conductive plate, and each of the data lines is connected with the second interface of the OLED drive circuit and one of the data fan-out leads.

10. The array substrate according to claim 8, wherein the conductive plate comprises a through hole pattern area, the fan-out lead structure comprises a fan-out lead area, an orthogonal projection of the through hole pattern area of the conductive plate on a surface of the array substrate is completely overlapped with an orthogonal projection of the fan-out lead area on the surface of the array substrate.

11. The array substrate according to claim 10, wherein the through hole disposing area provided with the plurality of via holes is located in the through hole pattern area.

12. The array substrate according to claim 8, wherein an orthogonal projection of at least part of the plurality of via holes on a surface of the array substrate is partially overlapped with an orthogonal projection of the data fan-out leads on the surface of the array substrate.

13. The array substrate according to claim 8, wherein an orthogonal projection of each of the via holes on a surface of the array substrate is partially overlapped with an orthogonal projection of the data fan-out leads on the surface of the array substrate.

14. The array substrate according to claim 8, wherein an orthogonal projection of each of the via holes on a surface of the array substrate is within a range of an orthogonal projection of the data fan-out leads on the surface of the array substrate.

15. The power line structure according to claim 8, wherein the first partial density increases linearly along the first direction, the second partial density increases linearly along the second direction, the third partial density increases linearly along the third direction, and the fourth partial density increases linearly along the fourth direction.

16. A display panel, comprising an array substrate, wherein the array substrate comprises a power line structure and a fan-out lead structure;
the fan-out lead structure comprises a plurality of data fan-out leads;
the power line structure comprises a conductive plate;
the conductive plate comprises a through hole disposing area, and the through hole disposing area is provided with a plurality of via holes;
in at least one sub-area of the through hole disposing area, a distribution density of the via holes increases along a direction in which a density of current in the conductive plate decreases;
the conductive plate further comprises a first input terminal, a second input terminal and a third input terminal;
the direction in which the density of current decreases comprises a first direction from the first input terminal to a middle point between the first input terminal and the second input terminal, and a second direction from the second input terminal to the middle point between the first input terminal and the second input terminal, a third direction from the second input terminal to a middle point between the second input terminal and the third input terminal, and a fourth direction from the third input terminal to the middle point between the second input terminal and the third input terminal;
the distribution density of the via holes comprises a first partial density increasing along the first direction, a second partial density increasing along the second direction, a third partial density increasing along the third direction, and a fourth partial density increasing along the fourth direction; and
the first partial density increases linearly along the first direction, the second partial density increases linearly along the second direction, the third partial density increases linearly along the third direction, and the fourth partial density increases linearly along the fourth direction.

* * * * *